(12) United States Patent
Yamada

(10) Patent No.: US 10,319,634 B2
(45) Date of Patent: Jun. 11, 2019

(54) SEMICONDUCTOR DEVICE HAVING MIM CAPACITOR

(71) Applicant: SUMITOMO ELECTRIC DEVICE INNOVATIONS, INC., Yokohama, Kanagawa (JP)

(72) Inventor: Fumio Yamada, Kanagawa (JP)

(73) Assignee: SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 0 days.

(21) Appl. No.: 15/688,325

(22) Filed: Aug. 28, 2017

(65) Prior Publication Data

US 2018/0061697 A1     Mar. 1, 2018

(30) Foreign Application Priority Data

Aug. 30, 2016  (JP) ................................. 2016-168569

(51) Int. Cl.
| | |
|---|---|
| *H01L 27/08* | (2006.01) |
| *H01L 49/02* | (2006.01) |
| *H01L 21/768* | (2006.01) |
| *H01L 23/522* | (2006.01) |
| *H01L 23/532* | (2006.01) |

(52) U.S. Cl.
CPC .... *H01L 21/7687* (2013.01); *H01L 21/76846* (2013.01); *H01L 23/5223* (2013.01); *H01L 23/53233* (2013.01); *H01L 23/53238* (2013.01); *H01L 27/0805* (2013.01); *H01L 28/75* (2013.01); *H01L 28/91* (2013.01); *H01L 2224/05* (2013.01); *H01L 2924/0002* (2013.01)

(58) Field of Classification Search
CPC ......... H01L 21/76846; H01L 23/53233; H01L 23/5223; H01L 23/53238; H01L 27/0805; H01L 28/91; H01L 21/7687
See application file for complete search history.

(56) References Cited

U.S. PATENT DOCUMENTS

| | | | | |
|---|---|---|---|---|
| 5,351,163 | A | * 9/1994 | Dawson | ................... H01G 4/08 257/277 |
| 2002/0045311 | A1 | * 4/2002 | Mikawa | ............ H01L 21/76895 438/240 |
| 2003/0089954 | A1 | * 5/2003 | Sashida | ............... H01L 21/7687 257/369 |
| 2006/0180938 | A1 | * 8/2006 | Kurihara | ............. H01L 21/4853 257/773 |

(Continued)

FOREIGN PATENT DOCUMENTS

| | | | | |
|---|---|---|---|---|
| JP | 05-183104 | | 7/1993 | |
| JP | 05183104 | * | 7/1993 | ............. H01L 27/04 |

(Continued)

*Primary Examiner* — Davienne N Monbleau
*Assistant Examiner* — Farid H Khan
(74) *Attorney, Agent, or Firm* — Smith, Gambrell & Russell, LLP

(57) ABSTRACT

A semiconductor device that provides a pad electrically connected to the metal layer and a capacitor connected to the pad is disclosed. The semiconductor device provides an insulating film between the lower electrode of the capacitor and the pad. Because the insulating film protects and isolates the lower electrode from etching of the substrate via and deposition of the via metal, the lower electrode avoids voids or vacancies during formation of the via and the via metal.

15 Claims, 7 Drawing Sheets

(56) References Cited

U.S. PATENT DOCUMENTS

| | | | | |
|---|---|---|---|---|
| 2010/0330758 | A1* | 12/2010 | Kim | H01L 21/7687 438/239 |
| 2011/0039409 | A1* | 2/2011 | Arikawa | G06F 17/5063 438/667 |
| 2011/0304011 | A1* | 12/2011 | Lee | H01L 21/561 257/531 |
| 2012/0319239 | A1* | 12/2012 | Chang | H01L 23/481 257/532 |
| 2014/0042590 | A1* | 2/2014 | Chen | H01L 28/60 257/532 |
| 2014/0319653 | A1* | 10/2014 | Fornara | H01L 23/5223 257/532 |
| 2016/0315047 | A1* | 10/2016 | Uzoh | H01L 23/5223 |
| 2017/0271281 | A1* | 9/2017 | Rodriguez | G01S 7/032 |

FOREIGN PATENT DOCUMENTS

| | | |
|---|---|---|
| JP | 2004-335536 | 11/2004 |
| JP | 2008-078547 | 4/2008 |

* cited by examiner

SEMICONDUCTOR DEVICE HAVING MIM CAPACITOR

CROSS REFERENCE TO RELATED APPLICATION

The present application claims the benefit of priority of Japanese Patent Application No. 2016-168569, filed on Aug. 30, 2016, which is incorporated herein by reference.

BACKGROUND OF THE INVENTION

1. Field of the Invention

The present invention relates to a semiconductor device, in particular, the invention relates to a positional

2. Background Arts

A capacitor type of metal-insulator-metal (MIM) may be built within a monolithic microwave integrated circuit (MMIC), where a MIM capacitor includes a lower electrode, an insulating film, and an upper electrode. A Japanese Patent laid open No. 2008-078547A has disclosed a technique where a built-in capacitor, which stacks a diffusion protection layer on a dielectric layer, is buried within a substrate and electrically connected to an interconnection through a via.

When a semiconductor substrate provides a via filled with a metal and an electrode on the top surface of the substrate where the electrode is electrically connected to the via, the substrate inevitable to expand a size thereof when the capacitor and the via are arranged in side by side. On the other hand, when the capacitor overlaps with the via, the dielectric in the capacitor possibly deforms in connection with the deformation of the via, which lowers the breakdown voltage of the capacitor.

SUMMARY OF THE INVENTION

An aspect of the present invention relates to a semiconductor device that provides a substrate, a semiconductor layer, a pad, a first insulating film and a capacitor. The semiconductor layer is provided on the substrate. The substrate and the semiconductor layer provides a via piercing the substrate and the semiconductor layer. The via provides a via metal therein. The pad, which is provided on the semiconductor layer, fully covers the via and connected with the via metal. The first insulating film covers the pad. The capacitor, which includes a lower electrode, a second insulating film, and an upper electrode in this order from a side of the first insulating film, is provided on the first insulating film. A feature of the present semiconductor device is that the first insulating film is sandwiched between the pad and the lower electrode of the capacitor.

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF EMBODIMENT

Next, preferred embodiment according to the present invention will be described as referring to accompanying drawings. In the description of the drawings, numerals or symbols similar to or same with each other will refer to elements same with or similar to each other without duplicating explanations.

First Embodiment

Figure 1A:
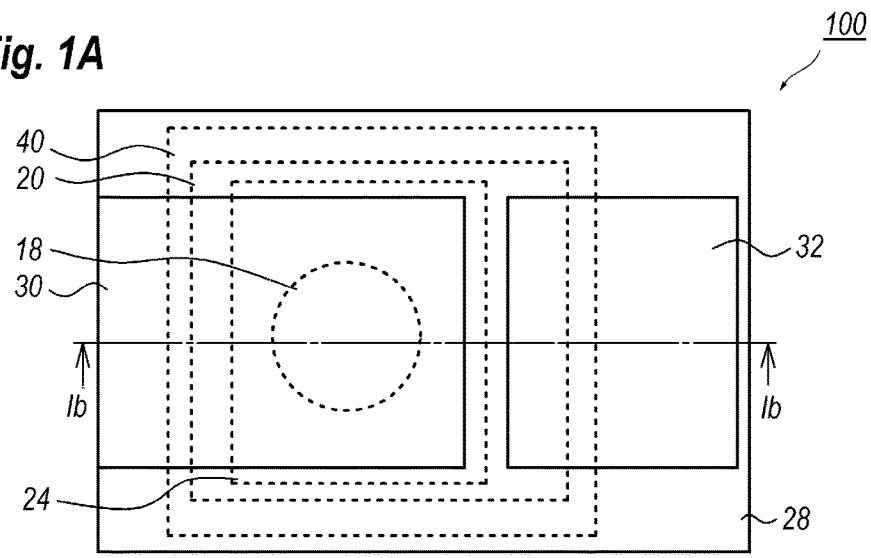
FIG. 1A is a plan view showing a semiconductor device according to the first embodiment of the present invention.
Figure 1B:
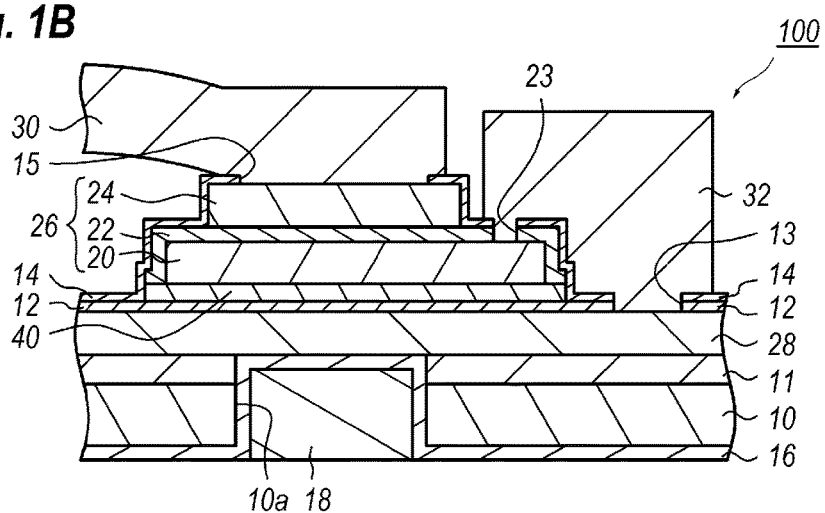
FIG. 1B shows a cross section taken along the line Ib-Ib indicated in FIG. 1A.

FIG. 1A is a plan view showing a semiconductor device according to the first embodiment of the present invention, and FIG. 1B shows a cross section taken along the line Ib-Ib indicated in FIG. 1A. The semiconductor device 100 provides a via 10a, a capacitor 26, a pad 28, which may be called as a first metal layer, and another insulating film 40, which may be called as a first insulating film, where those elements, 10a to 40, are overlapped along a direction normal to a substrate 10.

The substrate 10, which provides a semiconductor layer 11 thereon as FIG. 1B illustrates, may be made of electrically insulating material typically silicon carbide (SiC), sapphire ($Al_2O_3$), and so on. The semiconductor layer 11 includes a channel layer made of gallium nitride (GaN), a barrier layer made of aluminum gallium nitride (AlGaN), or else. The substrate 10 and the semiconductor layer 11 may have a total thickness of about 100 μm. The semiconductor layer 11 may form, for instance, a field effect transistor (FET) that is electrically connected to an interconnection, which may be a micro strip line. The capacitor 26 is connected between this interconnection and the ground.

The substrate 10 and the semiconductor layer 11 provide the via 10a piercing from a back surface of the substrate 10 to a top surface of the semiconductor layer 11, where the via 10a has a diameter of about 100 μm. The via 10a provides in a side wall thereof, and a metal layer 16 that extends from the side wall to the whole back surface of the substrate 10, which may be called as a metal layer 16. The metal layer 16, which may be operable as the ground for the FET and the micro strip line, is made of gold (Au) with a thickness of 5 to 10 μm. The via 10a also provides a via electrode 18, which may be formed by plating so as to fill the whole via 10a on the metal layer 16. The via electrode 18 may be made of copper (Cu).

Provided on the semiconductor layer 11 and the via 10a is the pad 28 that has an area greater than the lower electrode 20 of the capacitor 26. That is, the pad 28 covers the whole of the via 10a. The pad 28 is in direct contact with the metal layer 16, that is, the pad 28 is electrically connected to the via electrode 18 and the metal layer 16. The pad 28 may be made of stacked metal of nickel (Ni) with a thickness of the 50 nm and gold (Au) with a thickness of the 500 nm. Provided on the pad 28 is an insulating film 12 made of, for instance, silicon nitride (SiN).

The insulating film 12 may provide the first insulating film 40 thereon such that the first insulating film 40 fully overlaps with the pad 28 and the via 10a. The first insulating film 40 may be made of one of silicon oxide (SiO) with a thickness of 200 nm, silicon nitride (SiN), and silicon oxy-nitride (SixOyNz, $0<x<1$, $0<y<1$, $0<z<1$).

The first insulating film 40 provides the lower electrode 20 thereon of the capacitor 26. The lower electrode 20 in sides and a top thereof provides the second insulating film 22. That is, the second insulating film 22 covers the sides and the top of the lower electrode 20. Provided on the second insulating film 22 is the upper electrode 24 so as to fully overlap with the lower electrode 20 and the via 10a. The lower electrode 20, the second insulating film 22, and the upper electrode 24 constitute the capacitor 26 of type of metal-insulator-metal (MIM). An area where the lower electrode 20, the second insulating film 22, and the upper electrode 24 overlap locates inside of the pad 28 but covers the whole of the via 10a. The lower electrode 20 and the upper electrode 24 are made of stacked metal of titanium (Ti) with a thickness of 10 nm, gold (Au) with a thickness of 200 nm, and other titanium (Ti) with the thickness of 50 nm. The lower electrode has a width of, for instance, 155 µm, while the upper electrode 24 has a width of 150 µm. The second insulating film 22 may be made of silicon nitride with a thickness of 200 nm.

Still another insulating film 14, which may be made of silicon nitride (SiN) with a thickness of 50 to 100 nm, covers the top of the insulating film 12, the second insulating film 22, and the upper electrode 24. The insulating film 14 provides an opening on the upper electrode 24 through which the top of the upper electrode 24 exposes. The interconnection 30, which is provided on the insulating film 14, is in direct contact with the upper electrode 14. Thus, the upper electrode 24 may be electrically connected to, for instance, the transmission line on the substrate 10 through the interconnection 30; that is, the capacitor 26 may be connected to the transmission line and/or active devices like the FET through the transmission line 30.

The insulating films, 12 and 14, provide another opening 13 on the pad 28 but outside of the lower electrode 20, through which the top of the pad 28 exposes. Also, the insulating films, 12 and 14, provide still another opening 23 on the lower electrode 20 but outside of the upper electrode 24, where the top of the lower electrode 20 exposes through the opening 13. The interconnection 32 may electrically connect the lower electrode 20 with the pad 28 through these openings, 13 and 23. Thus, the lower electrode 20 may be connected to the metal layer 16, or the via electrode 18 in the via 10a, through the interconnection 32 and the pad 28.

Figure 2A:
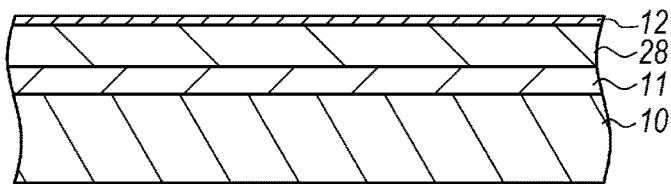
FIGS. 2A to 2H show processes of forming the semiconductor device shown in FIG. 1A according to the first embodiment of the present invention.
Figure 2B:
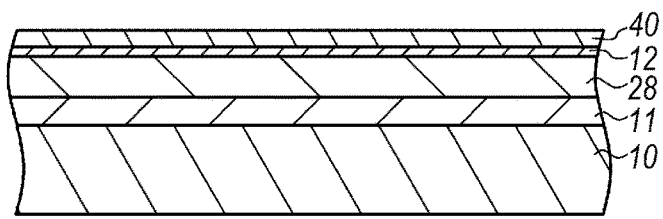
Figure 2C:
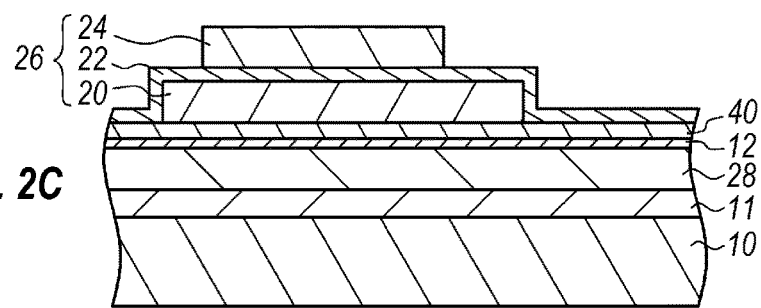
Figure 2D:
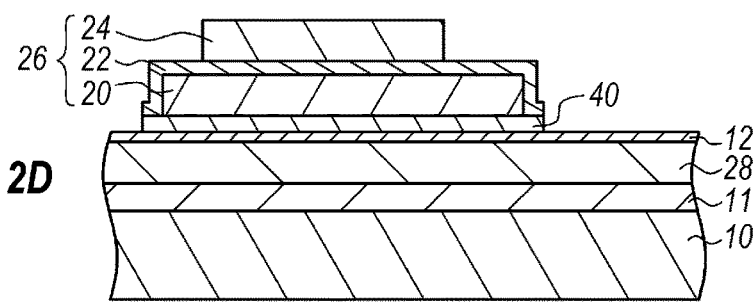

FIGS. 2A to 2H show the processes of forming the semiconductor device 100. As shown in FIG. 2A, the semiconductor layer 11 is first grown on the substrate 10, then, the metal evaporation accompanied with a subsequent lift-off technique, or the sputtering accompanied with a subsequent etching, may form the pad 28 on the semiconductor layer 11. Thereafter, the chemical vapor deposition (CVD) technique or the like may deposit the insulating film 12 on the pad 28, and also the CVD technique or the like may deposit the first insulating film 40 on the former insulating film 12 as shown in FIG. 2B.

Thereafter, the metal evaporation with the lift-off technique, or the sputtering with the etching, may form the lower electrode 20. The CVD may deposit the second insulating film 22 so as to cover the top and the sides of the lower electrode 20 and the top of the first insulating film 40 exposed from the lower electrode 20. Then, the metal evaporation with the lift-off technique, or the sputtering with the etching, may form the upper electrode 24 on the second insulating film 22 so as to overlap with the lower electrode 20. Thus, the capacitor 26 comprised of the lower electrode 20, the second insulating film 22, and the upper electrode 24 may be formed on the first insulating film 40 as shown in FIG. 4C.

Figure 2E:
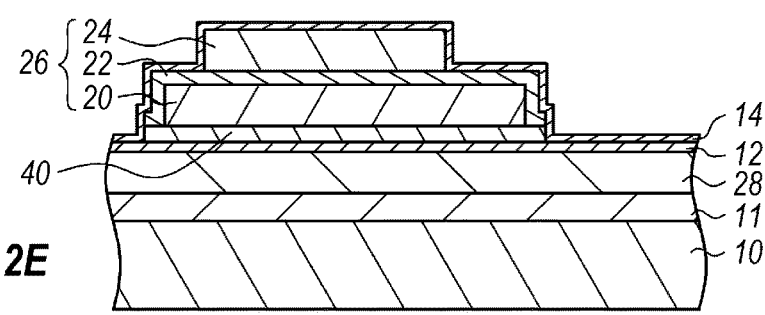

Thereafter, the etching may partly remove the second insulating film 22 and the first insulating film 40 so as to leave a portion of the second insulating film 22 that covers the sides of the lower electrode 20 and a portion of the first insulating film 40 beneath the lower electrode 20 and the second insulating film 22, as shown in FIG. 4D. Then, the CVD may deposit the insulating film 14 so as to cover the whole of the substrate 10; that is, the insulating film 14 covers the insulating film 12 exposed from the capacitor 26 and the top and the sides of the capacitor 26, as shown in FIG. 2E.

Figure 2F:
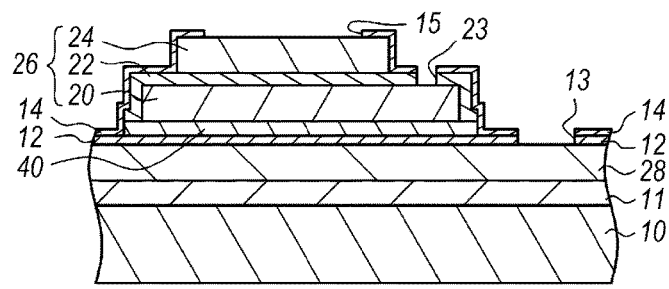
Figure 2G:
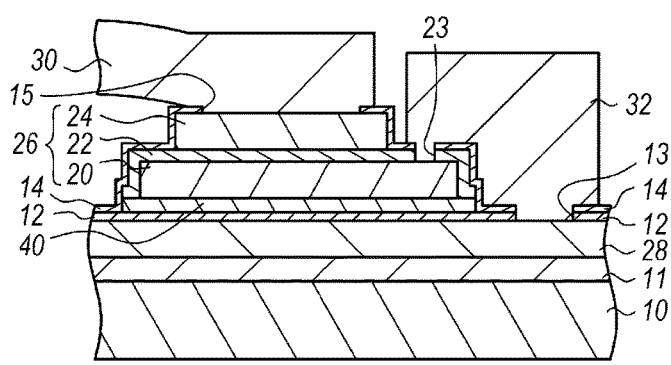

Thereafter, the etching may form openings, 13, 15, and 23, in the in the insulating film 14, the second insulating film 22, and the insulating film 12, as shown in FIG. 2F. Because those insulating films, 12, 14, and 22, are made of inorganic material containing silicon (Si), the etching by a reactive gas containing fluorine (F) may etch those insulating films, 12, 14, and 22, without changing the etching gas. Also, because metal layers exist beneath those insulating films, 12, 14, and 22, that is, the upper electrode 24 is beneath the insulating film 14, the lower electrode 20 is beneath the insulating films, 14 and 22, and the pad 28 is beneath the insulating films, 12 and 14; the etching for those insulating films, 12, 14, and 22, may be securely stopped at the metal layers, 24, 22, and 28. After forming the openings, 13, 15, and 23, the metal plating or the like may form the interconnections, 30 and 32, so as to be in contact with the upper electrode 24, the lower electrode 20, and the pad 28, as shown in FIG. 2G.

Figure 2H:
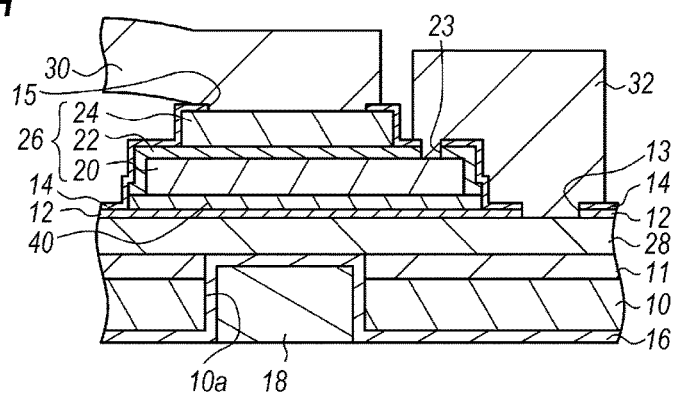

Thereafter, the process thins the substrate 10 by grinding the substrate 10 from the back thereof to a total thickness of about 100 µm including the semiconductor layer 11. Then, the via 10a is formed so as to pierce the substrate 10 and the semiconductor layer 11. That is, the etching from the back of the substrate 10 to the pad 28 may form the via 10a. The back surface of the pad 28 exposes within the bottom of the via 10a. The metal evaporation or the like may form the metal layer 16 so as to cover the bottom and the side of the via 10a and the whole back surface of the substrate 10. Then, the plating using the metal layer 16 as the seed metal may form the via electrode 18 within the via 10a, as shown in FIG. 2H. Thus, the process of forming the semiconductor device 100 with the capacitor 26 is completed.

Figure 3A:
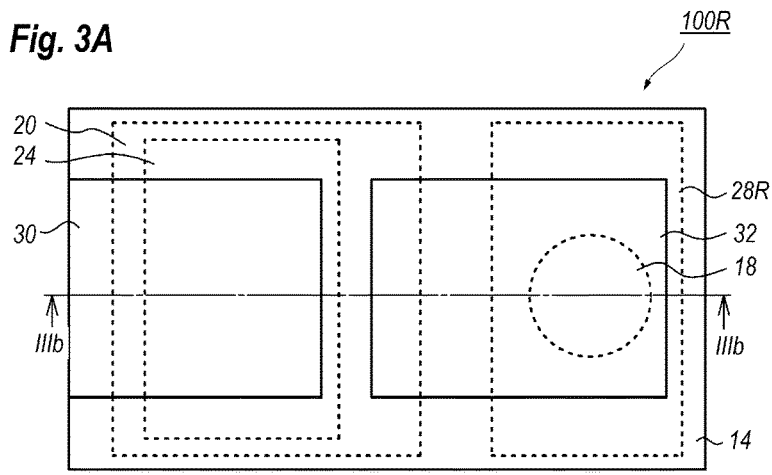
FIG. 3A is a plan view showing a semiconductor device comparable to the present invention.
Figure 3B:
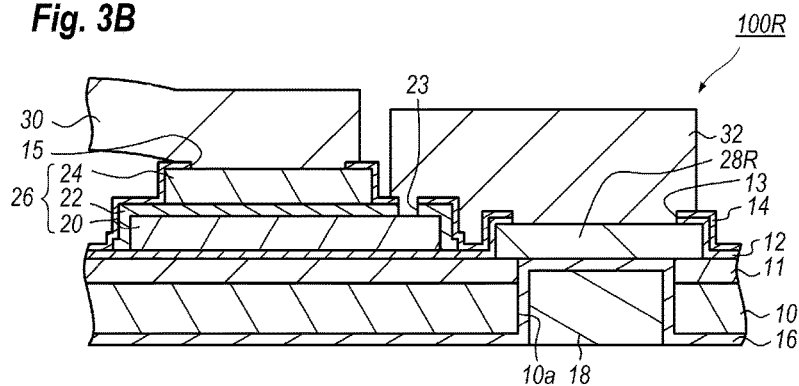
FIG. 3B shows a cross section taken along the ling IIIb-IIIb indicated in FIG. 3A.

FIG. 3A is a plan view showing a semiconductor device 100R comparable to the present invention, and FIG. 3B shows a cross section taken along the ling IIIb-IIIb indicated in FIG. 3A. The semiconductor device 100R has the capacitor 26 and the pad 28R arranged in side by side on the substrate 10. The pad 28R overlaps with the via electrode 18. Accordingly, although the capacitor 26, in particular, the lower electrode 20 thereof may be free from the process of forming the via 10a, that is, the etching of the substrate 10 and the semiconductor layer 11 causes substantially no influence on the lower electrode 20 of the capacitor 26, the area of the capacitor 26 including the pad 28 inevitably becomes wider.

Figure 4A:
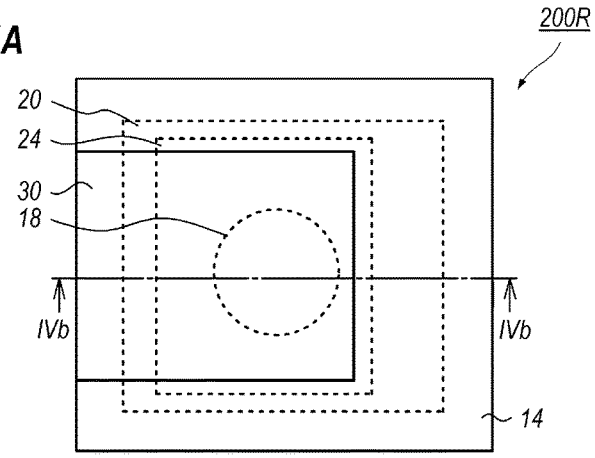
FIG. 4A is a plan view shown still another semiconductor device.
Figure 4B:
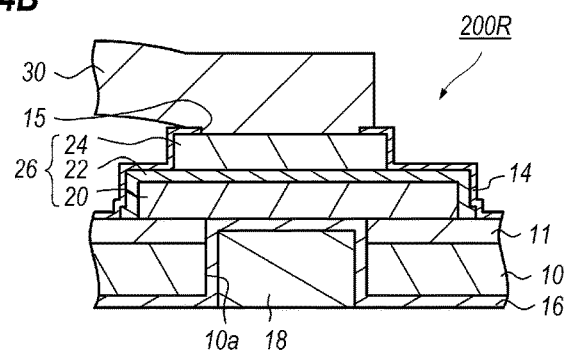
FIG. 4B shows a cross section of the semiconductor device taken along the line IVb-IVb indicated in FIG. 4A, and FIG. 4C also shows a cross section of the semiconductor device accompanied with a failure in a pad thereof.
Figure 4C:
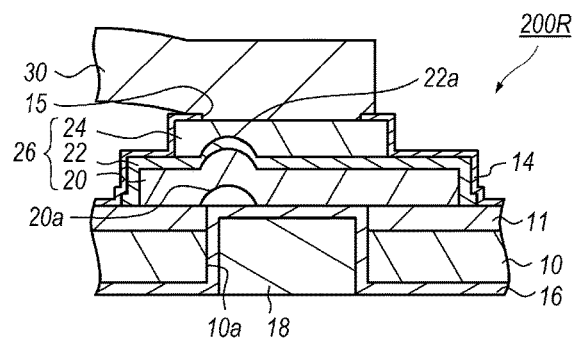

FIG. 4A is a plan view shown still another semiconductor device, FIG. 4B shows a cross section of the semiconductor device taken along the line IVb-IVb indicated in FIG. 4A, and FIG. 4C also shows a cross section of the semiconductor device accompanied with a failure in a pad thereof. As shown in FIGS. 4A and 4B, the capacitor 26 overlaps with the via electrode 18 in the semiconductor device 200R, and the lower electrode 20 of the capacitor 26 is in direct contact with the metal layer 16 in the via 10a. Thus, the lower electrode 20 of the capacitor 26 operates as the pad 28 in the aforementioned semiconductor devices. Because the capacitor 26 overlaps with the via electrode 18, the semiconductor device 200R may save an area thereof on the substrate 10 compared with the lastly explained semiconductor device 100R.

However, the process of forming the via 10a that includes a hard etching of the substrate 10 and the semiconductor layer 11, which possibly deforms the lower electrode 20, and/or heat treatment subsequently carried out for the metal layer 16 and the via electrode 18 possibly causes failures in the lower electrode 20, which expands cleaning solvent or plating solution left within the via 10a. Thus, the lower electrode 20 may cause voids 20a in the interface against the metal layer 16, and those voids may be reflected in the insulating film 22 as bumps 22a that reduces effective thicknesses of the insulating film 22. Thus, the capacitor 26 lowers the breakdown voltage thereof.

The semiconductor device 100 of the present embodiment provides the pad 28 that overlaps with the via electrode 18, and the first insulating film 40 also overlaps with both of the pad 28 and the via electrode 18. The pad 28 is necessary to make the etching selectivity against the semiconductor materials of the substrate 10 and the semiconductor layer 11 compatible with the lowered contact resistance against the metal layer 16. Gold (Au) is a typical metal for the pad 28. However, gold (Au) is relatively soft material for suppressing the generation of the voids, 20a and 22a. Accordingly, the semiconductor device 100 of the present embodiment provides the first insulating film 40 made of stiffy material on the pad 28 to reinforce the stiffness of the pad 28.

The first insulating film 40 may be made of silicon oxide (SiO), titanium (Ti) and so on but silicon oxide (Si) is preferably from a viewpoint of workability thereof. In order to prevent the voids, stiff material formed in thicker is preferable; for instance, a stiff material with a thickness greater than 500 nm is preferably. Titanium (Ti) may be deposited in thick, more than 500 nm, but is hard to be etched in the subsequent process. Therefore, when a semiconductor device provides a material between the pad 28 and the lower electrode 20 made of titanium (Ti), titanium film (Ti) is necessary to be formed thinner. Accordingly, a material put between the lower electrode 20 and the pad 20 for suppressing the voids, 20a and 22a, is preferably made of silicon oxide (SiO). Because the first insulating film 40 made of silicon oxide (SiO) covers the pad 28, at least an area overlapping with the via electrode 18, the pad 28 may be prevented from causing voids. Accordingly, the lower electrode 20 causes substantially no voids 20a, so does the second insulating film 22.

Because the first insulating film 40 is put between the lower electrode 20 and the pad 28, an additional interconnection 32 that connects the lower electrode 20 with the pad 28 is necessary. The semiconductor device 100 of the embodiment provides the interconnection 32 that connects the top of the lower electrode 20 through the opening 23 to the top of the pad 28 through the opening 13. The lower electrode 28 is necessary to extend for forming the opening 23, and the pad 28 is also necessary to extend for forming the opening 23 in the side of the capacitor 32, which widen the area where the semiconductor device 100 occupies on the substrate 10. However, the capacitor 26 itself overlaps with the via electrode 18 and the pad 28, the extension of the lower electrode 20 and the pad 28 are restrictive. Thus, the semiconductor device 100 may suppress the plane size of the substrate 10 without degrading the breakdown voltage of the capacitor 26.

The first insulating film 40 may be an inorganic material containing silicon (Si) such silicon oxide (SiOx), silicon nitride (SiNx), silicon oxy-nitride (SiON) and so on. Those materials have enough stiffness to effectively prevent the pad 28 from being deformed during the formation of the via 10a and the via electrode 18. Materials constituting the first insulating film 40 have merely necessary to have stiffness greater than the pad 28, and aluminum oxide ($Al_2O_3$), hafnium oxide (HfO), tantalum oxide (TaO), and so on are applicable to the first insulating film 40. The first insulating film 40 may have a thickness greater than 100 nm to show the stiffness but thinner than 600 nm to suppress stress and to lower a height of the capacitor 26.

The pad 28, which includes gold (Au), shows etching electivity against the semiconductor layer 11 during the formation of the via 10a. That is, etching for the via 10a may be effectively stopped at the bottom of the pad 28. Also, the pad 28 including gold (Au) shows lower resistivity. Thus, because the pad 28 has relatively lesser stiffness but better electrical conductivity; and the first insulating film 40 may compensate this lesser stiffness. The pad 28 may be, instead of gold (Au), made of aluminum (Al), copper (Cu), and other metals.

The lower electrode 20 and the pad 28 are electrically isolated by the first insulating film 40 therebetween. However, the interconnection 32 outside of the capacitor 26 may connect the pad 28 with the lower electrode 20. As FIG. 1B indicates, the interconnection 32 is in contact with the lower electrode 20 in the area outside of the upper electrode 24 and with the pad 28 in the area outside of the lower electrode 24. Thus, the lower electrode 20 may be connected to the metal layer 16, or the via electrode 18, which may provide the ground, through the interconnection 32 and the pad 28.

Second Embodiment

Figure 5A:
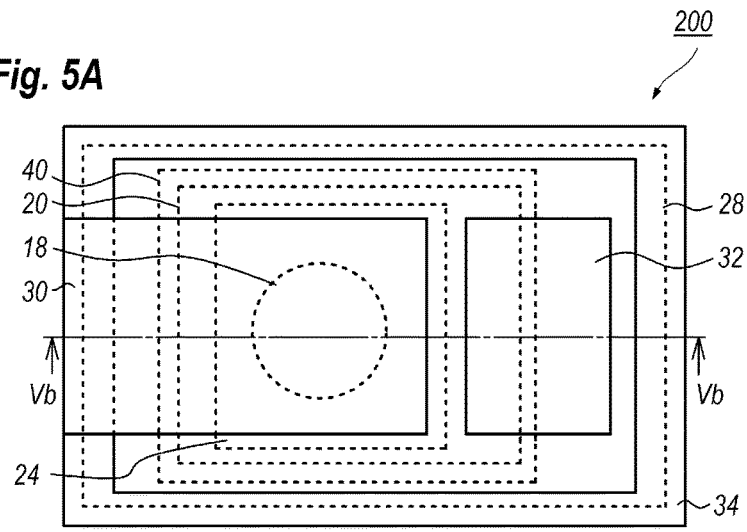
FIG. 5A is a plan view of a semiconductor device according to the second embodiment of the present invention.
Figure 5B:
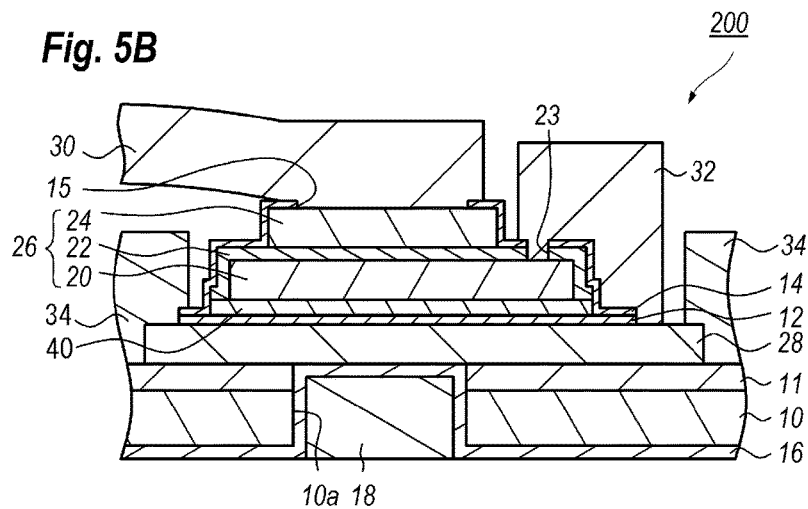
FIG. 5B shows cross section taken along the line Vb-Vb indicated in FIG. 5A.

FIG. 5A is a plan view showing another semiconductor device 200 according to the second embodiment of the present invention, and FIG. 5B shows a cross section of the semiconductor device 200 taken along the line Vb-Vb indicated in FIG. 5A.

As shown in FIGS. 5A and 5B, the capacitor 26 of the second embodiment overlaps with the pad 28 as interposing the first insulating film 40 therebetween. The semiconductor device 200 of the second embodiment has a feature that another interconnection 34, which is the third interconnection, surrounds the capacitor 26 and the pad 28 is connected to the semiconductor layer 11. The third interconnection 34, which is connected to the metal layer 16 and the via electrode 18 through the pad 28, gives the ground level. The interconnection 30, which is connected to the upper electrode 24, overlaps with the third interconnection 34 but makes a gap against the third interconnection 34. The interconnections, 32 and 34, may be concurrently formed by plating but independent of the formation of the interconnection 30, which may be formed also by metal plating subsequent to the former plating for the interconnections, 32 and 34.

The semiconductor device 200 of the second embodiment may effectively suppress the degradation of the capacitor 26, in particular, the reduction of the breakdown voltage thereof without enlarging the space of the capacitor 26. The third interconnection 34, which is formed in the periphery of the capacitor 26 and extending to the semiconductor layer 11, where this arrangement may effectively press down the pad 28 by the third interconnection 34. Resultantly, the third interconnection 34 may suppress the pad 26 from being deformed during the etching of the via hole 10a and the deposition of the via electrode 18. The capacitor 26 may be suppressed from being reduced in the breakdown voltage thereof.

Third Embodiment

Figure 6A:
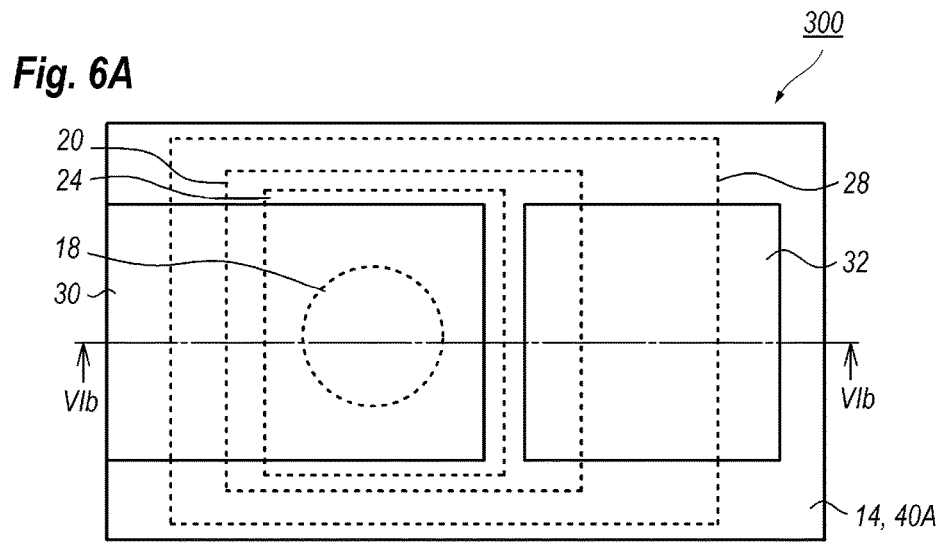
FIG. 6A is a plan view of a semiconductor device according to the third embodiment of the invention.
Figure 6B:
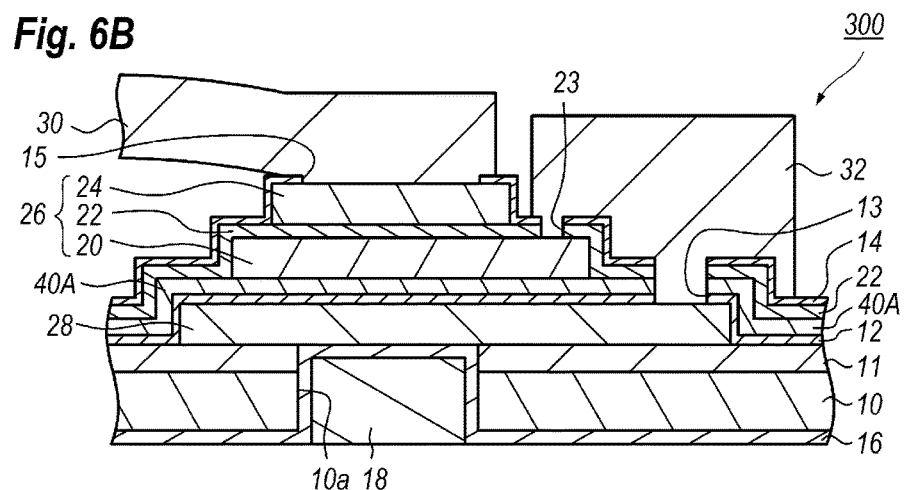
FIG. 6B shows a cross section taken along the lone VIb-VIb indicated in FIG. 6A.

FIG. 6A is a plan view of still another embodiment according to the present invention, and FIG. 6B shows a cross section taken along the line IVb-IVb indicated in FIG. 6. The semiconductor device 300 has a feature that the first insulating film 40A has an area wider than the pad 28. That is, the first insulating film 40A of the present embodiment covers the top and sides of the pad 28, and extends to the top of the semiconductor layer 11. The second insulating film 22 covers the top of the lower electrode 20, the top and the sides of the first insulating film 40A. The insulating film 40A covers the top of the upper electrode 24 and the top of the second insulating film 22. The first opening 13 is provided in the insulating films, 12, 40A, 22, and 40, so as to expose the top of the pad 28.

Because the lower electrode 20 is isolated from the pad 28 by the first insulating film 40A, the lower electrode 20 becomes free from the formation of the via 10a and the via electrode 18. That is, the insulating film 40A may effectively suppress the deformation in the lower electrode 20 caused by the etching of the substrate 10 and the semiconductor layer 11, and the formation of the metal layer 16 and the via electrode 18 by the existence of the first insulating film 40A. Also, the capacitor 26 fully overlaps with the pad 28, the semiconductor device 300 is unnecessary to expand plane sizes thereof. Because the first insulating film 40A covers pad 28 and the semiconductor layer 11, the first insulating film 40A is unnecessary to be etched so as to follow the plane shape of the pad 28.

The interconnection 32 of the first to third embodiment described above connects the lower electrode 20 with the pad 28. However, the interconnection 32 may connect at least one of the lower and the upper electrodes, 20 and 24, with the pad 28. When the interconnection 32 connects the upper electrode 24 with the pad, the lower electrode 20 is connected with another interconnection.

The via 10a is passed the substrate 10 and the semiconductor layer 11 in the aforementioned embodiment. However, when the semiconductor layer 11 does not extend on a whole substrate 10, the via 10a may be formed only passing the substrate 10 and the capacitor 26 accompanied with the pad 28 may be formed of the substrate 10. Also, the via electrode 18 is not always to be formed. Only the metal layer 16 may be operable as a via electrode 18.

The capacitor 26, the pad 28, and the first insulating film, 40 or 48, are vertically overlapped with the via 10a or the via electrode 18 in the aforementioned embodiment. However, those vertical arrangement may overlap with a part of the via 10a, or the via electrode 18. Also, the lower electrode 20 and the upper electrode 24 have plane sizes wider than the plane size of the via 10a, or the via electrode 18; but the via electrode 18 may have a plane size in the top thereof wider than the plane size of the lower electrode 20 and the upper electrode 24.

The other insulating films, 12 and 14, are not always necessary. Also, the interconnections, 30 and 32, may be replaced to bonding ribbons and/or bonding wires. The semiconductor layer 11 may be made of arsenide semiconductor materials and/or nitride semiconductor materials. The latter materials contain nitrogen (N) typically gallium nitride (GaN), aluminum gallium nitride (AlGaN), indium allium nitride (InGaN), indium nitride (InN), and aluminum indium gallium nitride (AlInGaN). The former materials may include gallium arsenide (GaAs), aluminum gallium arsenide (AlGaAs), and so on. The semiconductor layer 11 may include an active device except for the FET. The capacitor 26, the pad 28, and the metal layer 16 or the via electrode 18 may be connected to those active devices.

While particular embodiment of the present invention has been described herein for purposes of illustration, many modifications and changes will become apparent to those skilled in the art. Accordingly, the appended claims are intended to encompass all such modifications and changes as fall within the true spirit and scope of this invention.

I claim:
1. A semiconductor device, comprising:
a substrate;
a semiconductor layer provided on the substrate, the substrate having a via piercing from a bottom of the substrate to a top of the semiconductor layer, the via providing a via metal therein;
a pad provided on the semiconductor layer and electrically connected with the via metal, the pad fully covering the via and having a periphery that does not overlap the via;
a first insulating film covering the pad;
a capacitor provided on the first insulating film, the capacitor including a lower electrode, a second insulating film, and an upper electrode from a side of the first insulating film; and
an interconnection that is connected with the periphery of the pad, the interconnection surrounding the pad and extending to an area where the pad exposes the semiconductor layer,
wherein the first insulating film is sandwiched between the pad and the lower electrode of the capacitor.
2. The semiconductor device of claim 1,
wherein the via metal fills the via.
3. The semiconductor device of claim 1,
wherein the via metal covers a side of the via and extends to a back surface of the substrate.
4. The semiconductor device of claim 1,
wherein the first insulating film extends to an outside of the pad and covers the semiconductor layer on the substrate.
5. The semiconductor device of claim 1,
wherein the capacitor is fully overlapped by the first insulating film, and the first insulating film is fully overlapped by the pad.
6. The semiconductor device of claim 1,
wherein the interconnection is connected with the lower electrode in an area outside of the upper electrode, and wherein the interconnection is connected with the pad in an area outside of the capacitor where the area outside of the capacitor forms the periphery of the pad.

7. The semiconductor device of claim 1,
further including another interconnection that connects the upper electrode with the pad,
wherein the another interconnection is connected with the pad in an area outside of the capacitor, the area outside of the capacitor forming the periphery of the pad.

8. The semiconductor device of claim 1,
wherein the second insulating film extends outside of the capacitor and covers sides of the lower electrode and a top of the pad.

9. The semiconductor device of claim 1,
wherein the pad contains gold (Au).

10. The semiconductor device of claim 1,
wherein the first insulating film is made of one of silicon oxide (SiOx), silicon nitride (SiNx), and silicon oxynitride (SiON).

11. A semiconductor device, comprising:
a substrate;
a semiconductor layer provided on the substrate, the substrate having a via piercing from a bottom of the substrate to a top of the semiconductor layer, the via providing a via metal therein;
a pad provided on the semiconductor layer and electrically connected with the via metal, the pad fully covering the via and having a periphery that does not overlap the via;
a first insulating film covering the pad; and
a capacitor provided on the first insulating film, the capacitor including a lower electrode, a second insulating film, and an upper electrode from a side of the first insulating film,
wherein the first insulating film is sandwiched between the pad and the lower electrode of the capacitor, and
wherein the second insulating film extends outside of the capacitor and covers sides of the lower electrode and a top of the pad.

12. The semiconductor device of claim 11,
wherein the via metal fills the via.

13. The semiconductor device of claim 11,
wherein the via metal covers a side of the via and extends to a back surface of the substrate.

14. The semiconductor device of claim 11,
wherein the pad contains gold (Au).

15. The semiconductor device of claim 11,
wherein the first insulating film is made of one of silicon oxide (SiOx), silicon nitride (SiNx), and silicon oxynitride (SiON).

* * * * *